US007164581B2

(12) United States Patent
Carullo et al.

(10) Patent No.: US 7,164,581 B2
(45) Date of Patent: Jan. 16, 2007

(54) MODULAR CHASSIS DIVIDED ALONG A MIDPLANE AND COOLING SYSTEM THEREFOR

(75) Inventors: Thomas J. Carullo, Marlton, NJ (US); Arthur G. Willers, Delran, NJ (US); Ryan K. Goodenough, Marlton, NJ (US)

(73) Assignee: Computer Network Technology Corp., Minneapolis, MN (US)

( * ) Notice: Subject to any disclaimer, the term of this patent is extended or adjusted under 35 U.S.C. 154(b) by 0 days.

(21) Appl. No.: 10/873,374

(22) Filed: Jun. 21, 2004

(65) Prior Publication Data

US 2005/0281005 A1    Dec. 22, 2005

(51) Int. Cl.
  G06F 1/16   (2006.01)
  H05K 9/00   (2006.01)
(52) U.S. Cl. ............... 361/687; 361/704; 361/818; 439/718; 710/302
(58) Field of Classification Search ........... 361/690, 361/790–791, 704, 752, 756, 679–687, 724–727; 439/718; 29/529; 710/302
See application file for complete search history.

(56) References Cited

U.S. PATENT DOCUMENTS

| 4,472,765 | A | 9/1984 | Hughes | 361/791 |
|---|---|---|---|---|
| 4,703,394 | A | 10/1987 | Petit et al. | 361/790 |
| 4,876,630 | A | 10/1989 | Dara | 361/791 |
| 5,867,369 | A * | 2/1999 | Antonuccio et al. | 361/796 |
| 5,912,801 | A | 6/1999 | Roy et al. | 361/690 |
| 5,959,841 | A | 9/1999 | Allen et al. | 361/725 |
| 6,175,507 | B1 | 1/2001 | Koradia et al. | 361/796 |
| 6,208,522 | B1 | 3/2001 | Manweiler et al. | 361/752 |
| 6,437,976 | B1 | 8/2002 | Wolff et al. | 361/683 |
| 6,459,589 | B1 | 10/2002 | Manweiler et al. | 361/752 |
| 6,628,521 | B1 | 9/2003 | Gustine et al. | 361/704 |
| 6,688,919 | B1 | 2/2004 | Sumer et al. | 439/718 |
| 6,717,316 | B1 * | 4/2004 | Asao et al. | 310/179 |
| 2002/0118526 | A1 * | 8/2002 | Fritz et al. | 361/796 |
| 2002/0194412 | A1 * | 12/2002 | Bottom | 710/302 |
| 2003/0206398 | A1 * | 11/2003 | Stamos et al. | 361/686 |
| 2005/0135069 | A1 * | 6/2005 | King et al. | 361/727 |

FOREIGN PATENT DOCUMENTS

WO    WO 00/58779    9/2000

* cited by examiner

*Primary Examiner*—Hung Van Duong
(74) *Attorney, Agent, or Firm*—Beck & Tysver, P.L.L.C.

(57) ABSTRACT

A chassis divides vertically, with front and rear sections of the chassis joined immediately adjacent a midplane printed circuit board that supports interconnectivity of electronic circuits. Wiring within the chassis is eliminated through directed connections of all components to the midplane. Minimal hardware is required for securing the front and rear sections together, and therefore accessing the midplane for assembly and service is convenient. All components except the midplane are installed and removed from either the front or rear of the chassis without opening or disassembling the chassis. The chassis layout and features facilitate effective cooling of the components in the chassis.

22 Claims, 16 Drawing Sheets

MODULAR CHASSIS DIVIDED ALONG A MIDPLANE AND COOLING SYSTEM THEREFOR

FIELD OF THE INVENTION

The present invention relates generally to a chassis for housing electrical circuitry and more particularly to a modular chassis with a midplane located at the juncture of front and rear chassis sections, with electrical circuitry components connecting to the midplane. The invention further relates to a cooling system for electrical circuitry within a chassis.

BACKGROUND OF THE INVENTION

High speed switches, routers and the like are assemblies of electrical circuitry, including printed circuit boards and supporting components such as power supplies and fans to cool the system. Such systems are typically housed in a chassis that in turn is often mounted in an equipment rack.

The printed circuit boards, include input/output (I/O) boards, processing boards and switching boards. Boards within the switch or router connect to other boards within the chassis, directly or indirectly, to allow data transfer therebetween.

To support the ever-increasing speed of communications in networks, interconnection topology incorporating a midplane in place of a typical backplane or series of backplanes, has been devised. Such a topology is described in U.S. Pat. No. 09/483,018, filed Jan. 13, 2000. This matrix switch topology provides a first array of parallel boards on one side of a midplane, a second array or parallel boards on the opposite side of the midplane, with the midplane oriented orthogonally to each array, and each array orthogonal to the other. Boards in both arrays connect to the midplane to allow data and power transfer therebetween.

Typical chassis have a rear panel that can be removed to access components to repair or replace them. With a midplane design, however, this rear access is inconvenient because to access the midplane, all of the components to the rear of the midplane must be removed to access the midplane.

Another issue for chassis design, particularly with a midplane, is providing for convenient connections between components. More specifically, when components are assembled in the chassis during manufacture, it is time-consuming and labor intensive to connect components through wires that must be manually and individually secured. Assembly time is lengthened, and therefore manufacturing cost is increased, since the manual connection of individual wires is slow and allows for errors which, when discovered, require diagnosis of the problem, disassembly, and reassembly, allowing for further connection error. Neatly containing wires and wire harnesses so that they are not in the way of other components is also a problem. Further, maintenance is slow and prone to connection error when individual wirings must be made. It would be desirable to provide snap-together connections such that by positioning a component in its designated, pre-determined position, the proper electrical connections are automatically or easily and quickly made, with little opportunity for error.

Expansion and upgradeability are other issues of concern for chassis for such systems. It would be desirable for a chassis to provide convenient, simple, error-resistant removal and insertion of components for upgrading and expanding the system, such that service can be performed quickly and reliably, with little opportunity for connection error. It would be particularly advantageous for such a system to allow service for repair, expansion, and upgrade while the system remains running.

Chassis design must also provide for efficient, effective cooling of the components inside because they generate heat during operation and will not operate properly or may be damaged if overheated.

SUMMARY OF THE INVENTION

The chassis design of the present invention addresses these and other concerns. The chassis of the present invention is divided along a midplane into front and rear sections, allowing convenient access to the midplane for quick, and therefore lower cost, manufacture and service. Captive hardware accessible from the rear of the chassis further facilitates convenient access to the interior of the chassis. Tabs and mating recesses along the junction between the front and rear chassis sections allow for safe and simple joining and disjoining of the front and rear sections. Further, components attached to the miplane can all be removed or installed without requiring disassembly or opening of the chassis.

A compact, modular configuration and layout to the electrical circuitry and supporting components further aids in making assembly and service of the system convenient. In particular, organization and layout of the components to allow direct connections via high density connectors of all components to the midplane, without individual wires, reduces manufacturing time and reduces errors in assembly and service. In addition, the quick connections facilitate quick and reliable servicing of the chassis for maintenance and upgrades.

Because printed circuit boards and power supplies generate heat, the chassis of the present invention provides a cooling system that accommodates the several modules organized on opposite sides of a midplane.

BRIEF DESCRIPTION OF THE DRAWINGS

An exemplary version of chassis for housing electrical circuitry is shown in the figures wherein like reference numerals refer to equivalent structure throughout, and wherein.

DETAILED DESCRIPTION OF PREFERRED EMBODIMENT(S)

Figure 1:
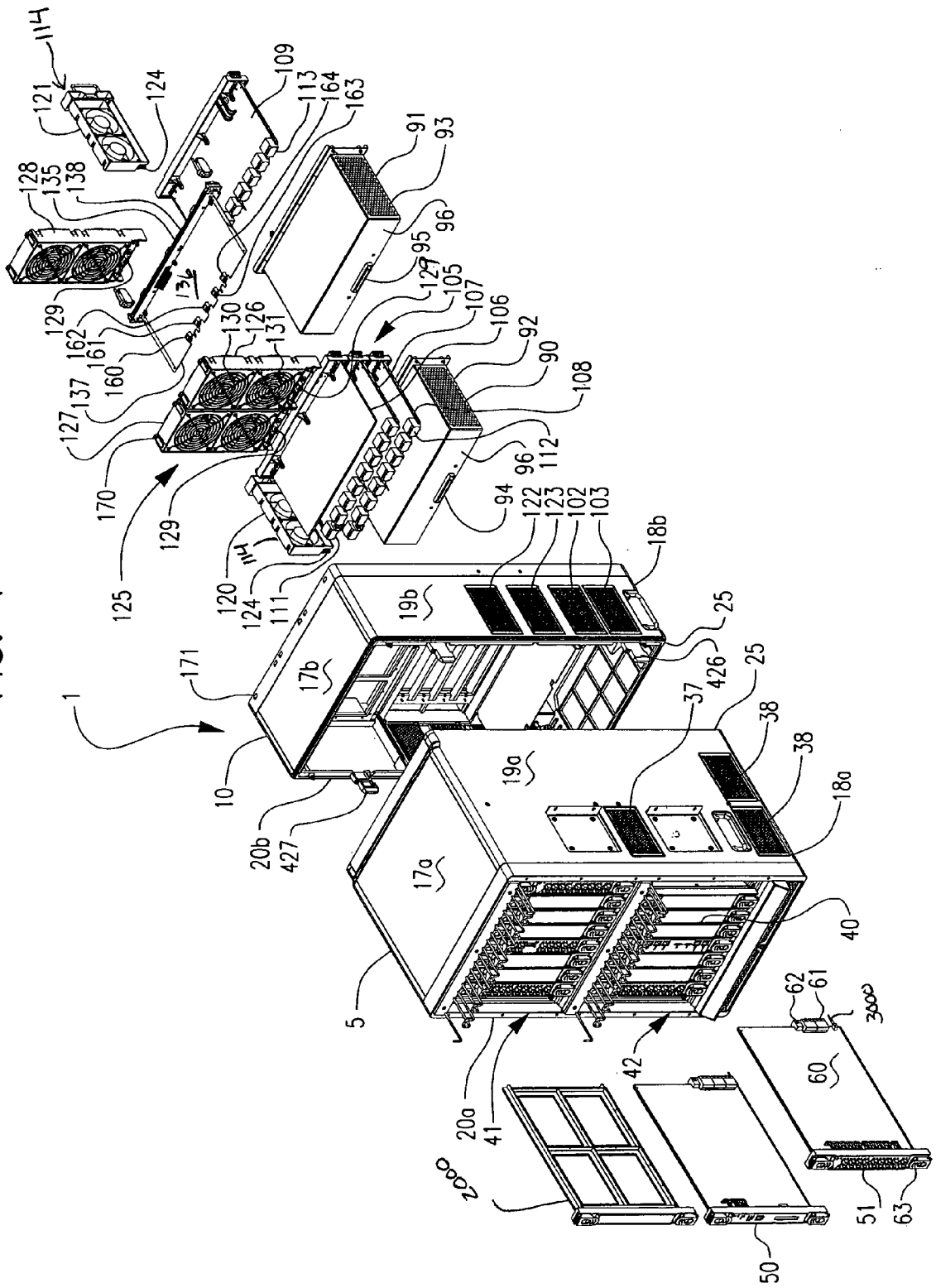
FIG. 1 is an exploded perspective view, generally from the front, of a chassis according to the present invention showing components.

FIG. 1 shows an exploded view of a preferred embodiment of a chassis 1 for housing electrical circuitry, such as high speed switching or routing systems. The chassis 1 has generally two sections: a front section 5 and a rear section 10. It should be understood that the terms "front" and "rear" as used throughout reflect the orientation pictured in FIG. 1, and are used consistently through this description and the claims. They do not, however, necessarily have operational meaning and are not intended to be limiting; in other words, they might be reversed throughout without altering the description. The same is true for the terms "top", "bottom", "side", "right", "left", "vertical" and "horizontal". The front section 5 houses or supports an array of printed circuit board assemblies as will be described below. The rear section 10 houses or supports fan assemblies, printed circuit board assemblies and power supplies, as will be described below.

Figure 6:
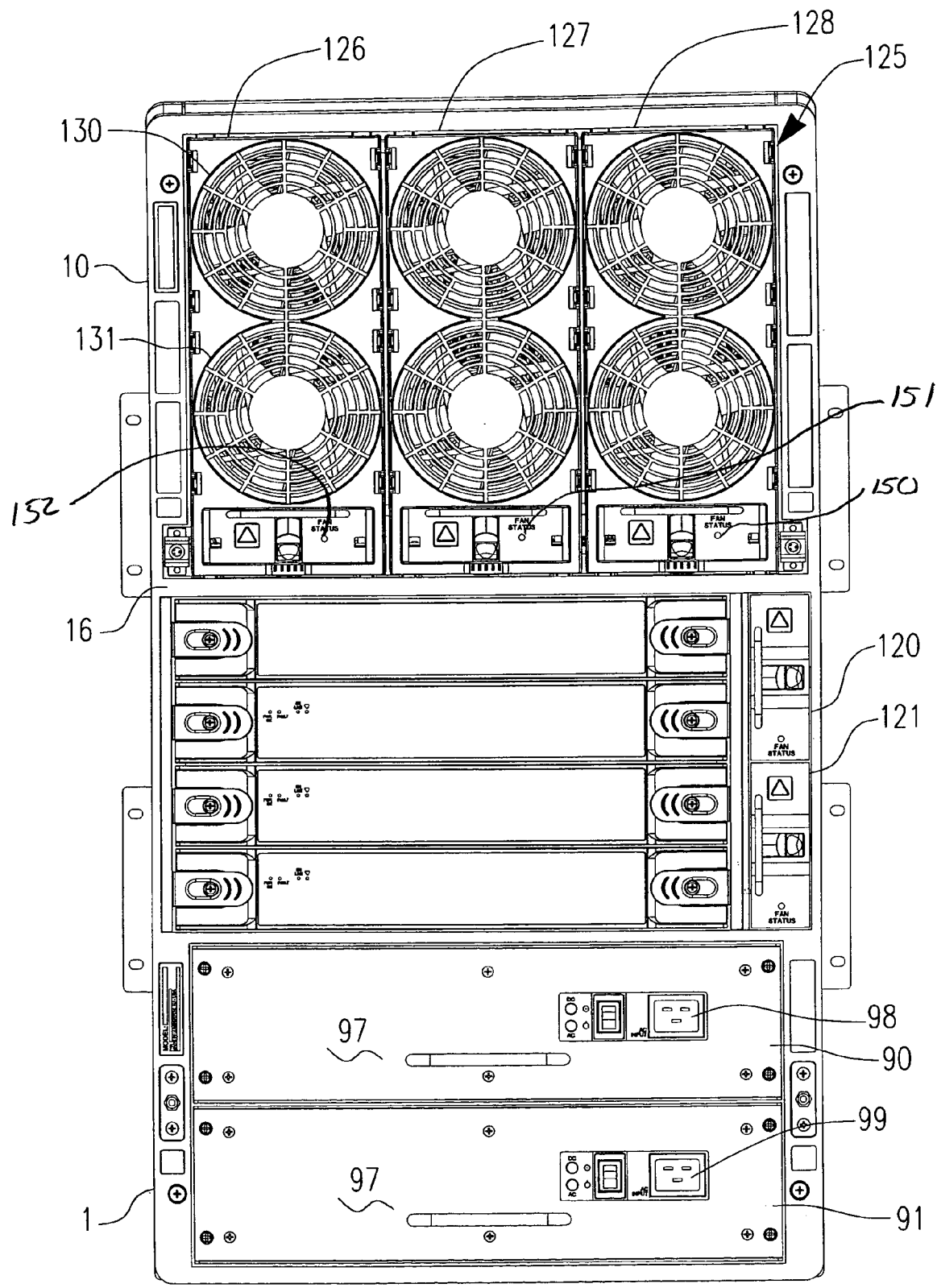
FIG. 6 is a rear view of the chassis of FIG. 1, with components installed.

The chassis 1 has a generally rectilinear configuration and has a front face 15 (FIG. 3), an opposite rear face 16 (FIG. 6), top face 17 (FIG. 1) and opposite bottom face 18 (FIG. 1) and side faces 19, 20 (FIG. 1). In the figures, the portion of each face 17–20 that is located in the front section 10 is designated with an "a" following the reference numeral; the portion of each faces that is located in the rear section 15 is designated with a "b" following the reference numeral.

The front and rear sections 5, 10 meet and mate along a mating joint 25 extending around the periphery of the chassis 1. More particularly, the front and rear sections 5, 10 are divided along a vertically-extending plane. The mating joint 25 lies distal from the front and rear faces of the chassis 1. More specifically, the distance between the front face 15 and the mating joint 25 on the front section 5 is sufficient to house a number of printed circuit board assemblies. Similarly, the distance between the rear face 16 and the mating joint 25 is sufficient to house a printed circuit board assembly. In a preferred embodiment, this distance is also sufficient to accommodate one or more power supply assemblies and one or more fan assemblies.

A preferred construction for the mating joint is described in U.S. Ser. No. 10/873373, filed Jun. 8, 2004, entitled EMI Shielded Chassis for Electrical Circuitry, and incorporated herein by reference. Generally, the joint 25 is preferably a lap joint with an EMC gasket to prevent electromagnetic energy from leaking from the chassis along the joint 25 when the front and rear sections 5, 10 are coupled together.

Figure 2:
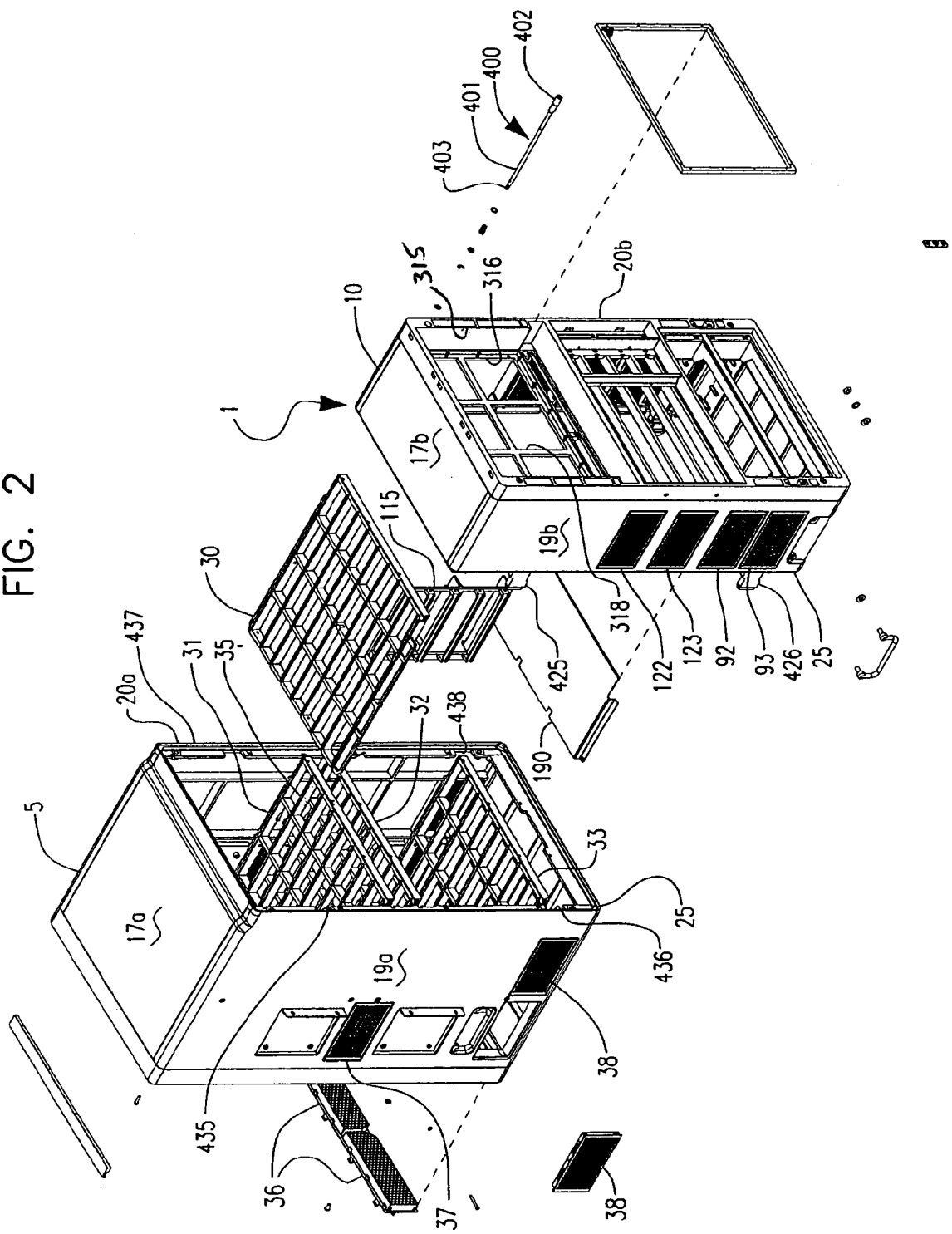
FIG. 2 is an exploded perspective view, generally from the rear, of a the chassis of FIG. 1, without components.

The front section 5 houses a number of printed circuit board assemblies. In a preferred embodiment, the front section 5 houses one or more arrays of printed circuit board assemblies. As illustrated in FIG. 2, the chassis 1 includes trays 30, 31, 32, 33 defining grooves therein for receiving and supporting the edges of printed circuit boards. A representative groove is marked with the reference number 35. In this manner, the chassis 1 provides predetermined slots or positions for printed circuit board assemblies. The trays 30–33 are mounted within the chassis, and the trays work in pairs 30, 31 and 32, 33, with their slots aligned, such that each printed circuit board is received by paired slots in paired trays.

Figure 3:
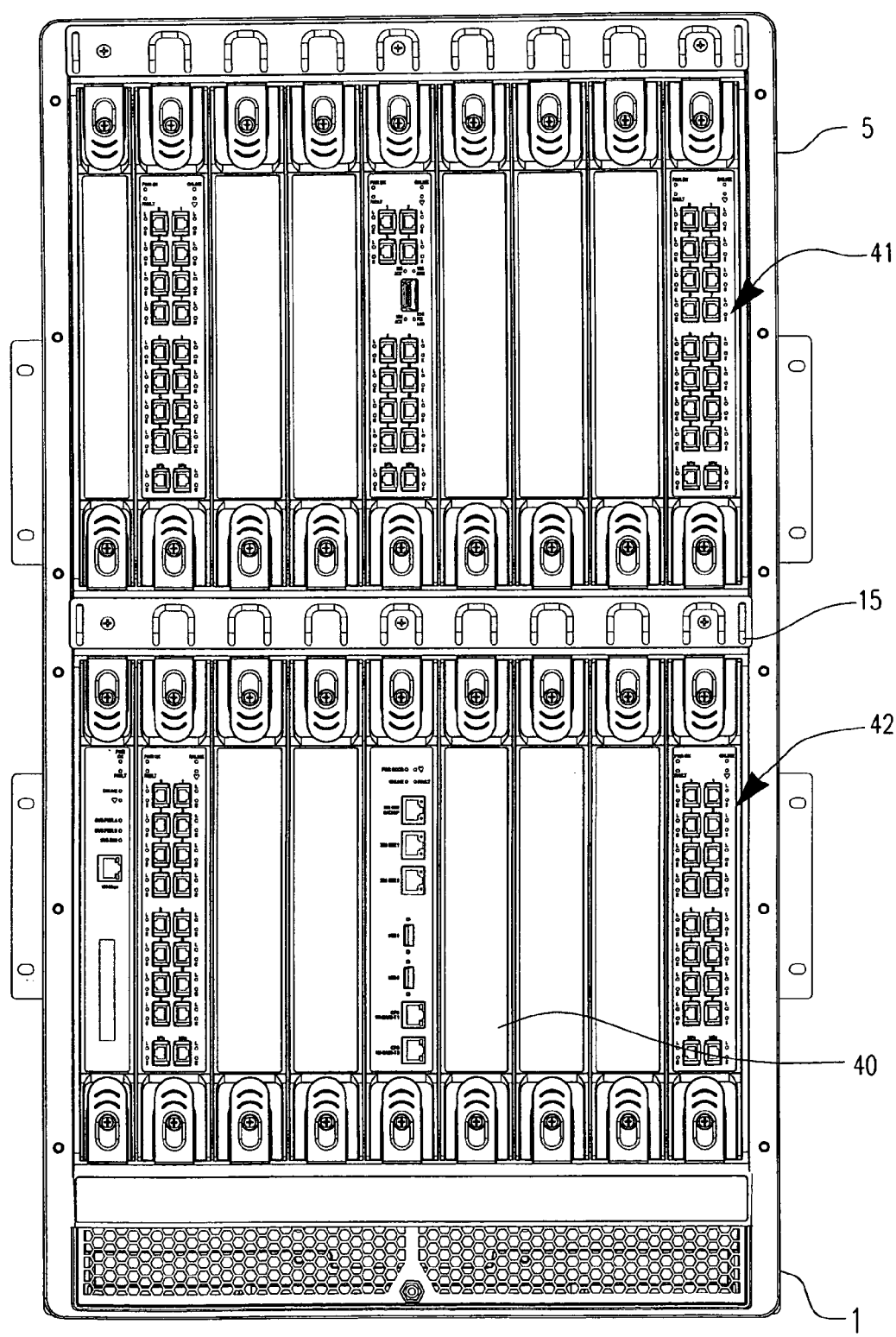
FIG. 3 is a front view of the chassis of FIG. 1, with components installed.

As illustrated in FIGS. 1, 2 and 3, the pictured embodiment provides predetermined board locations to receive up to eighteen board assemblies (a representative board assembly is given by reference number 40, in two arrays 41, 42 of nine each. It should be understood, however, that other numbers of arrays and other numbers of boards may be accommodated by a chassis 1 according to the present invention. The printed circuit board (PCB) assemblies are oriented generally vertically, with boards, typified by two such boards designated by reference numbers 50, 51, within an array 41, 42 being generally parallel to one another.

FIG. 1 shows printed circuit board assemblies 50, 51 floating outside of their predetermined locations within the chassis 1. Each printed circuit board assembly 50, 51, and the others residing in the chassis 1, includes a printed circuit board 60, electrical connectors 61 for data transfer with mating components, power connector 62 for receiving power from another component, and a face plate 63.

Figure 4A:
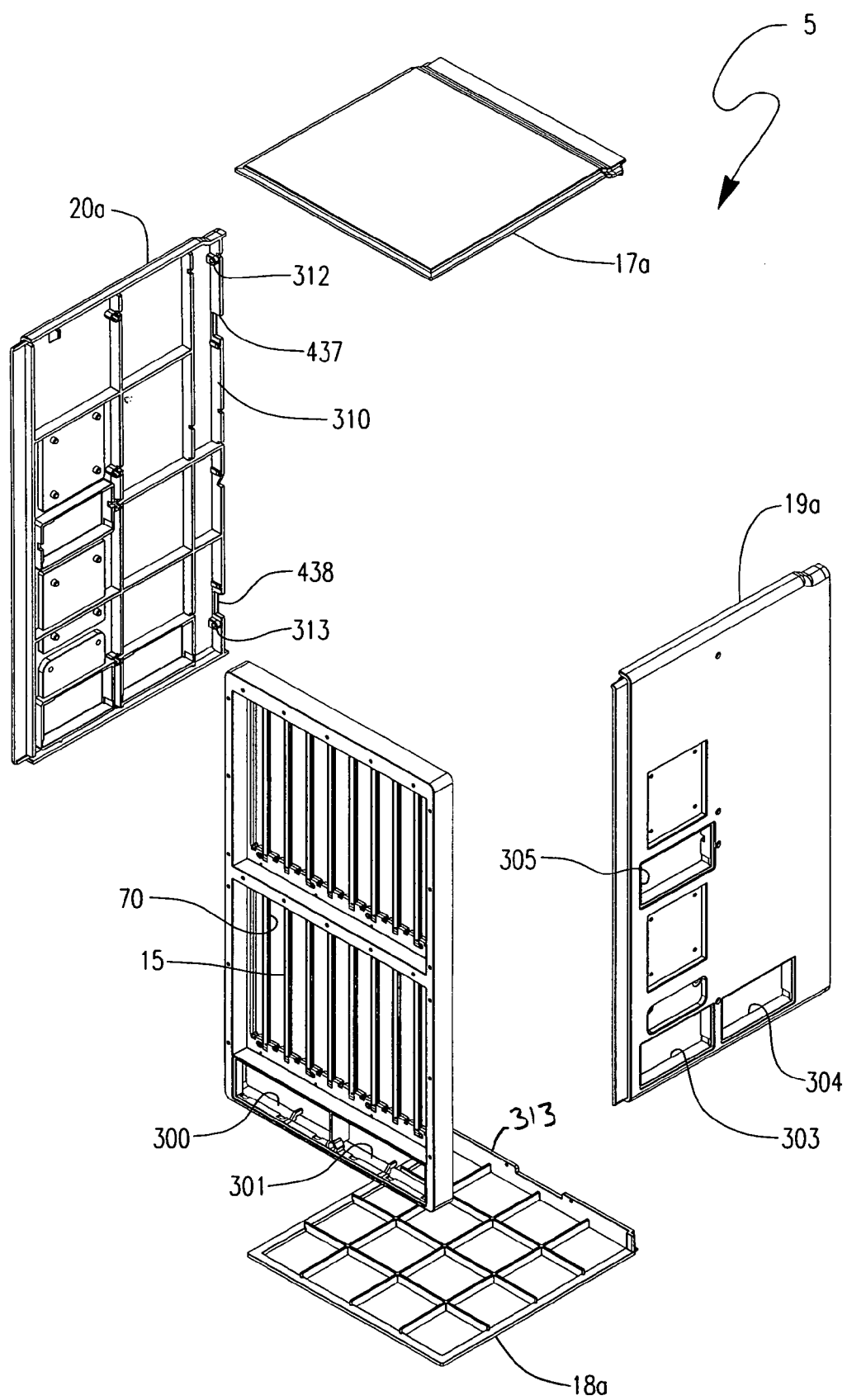
FIG. 4a is an exploded perspective view, viewed generally from the front, of the front section of the chassis of FIG. 1, without components.
Figure 4B:
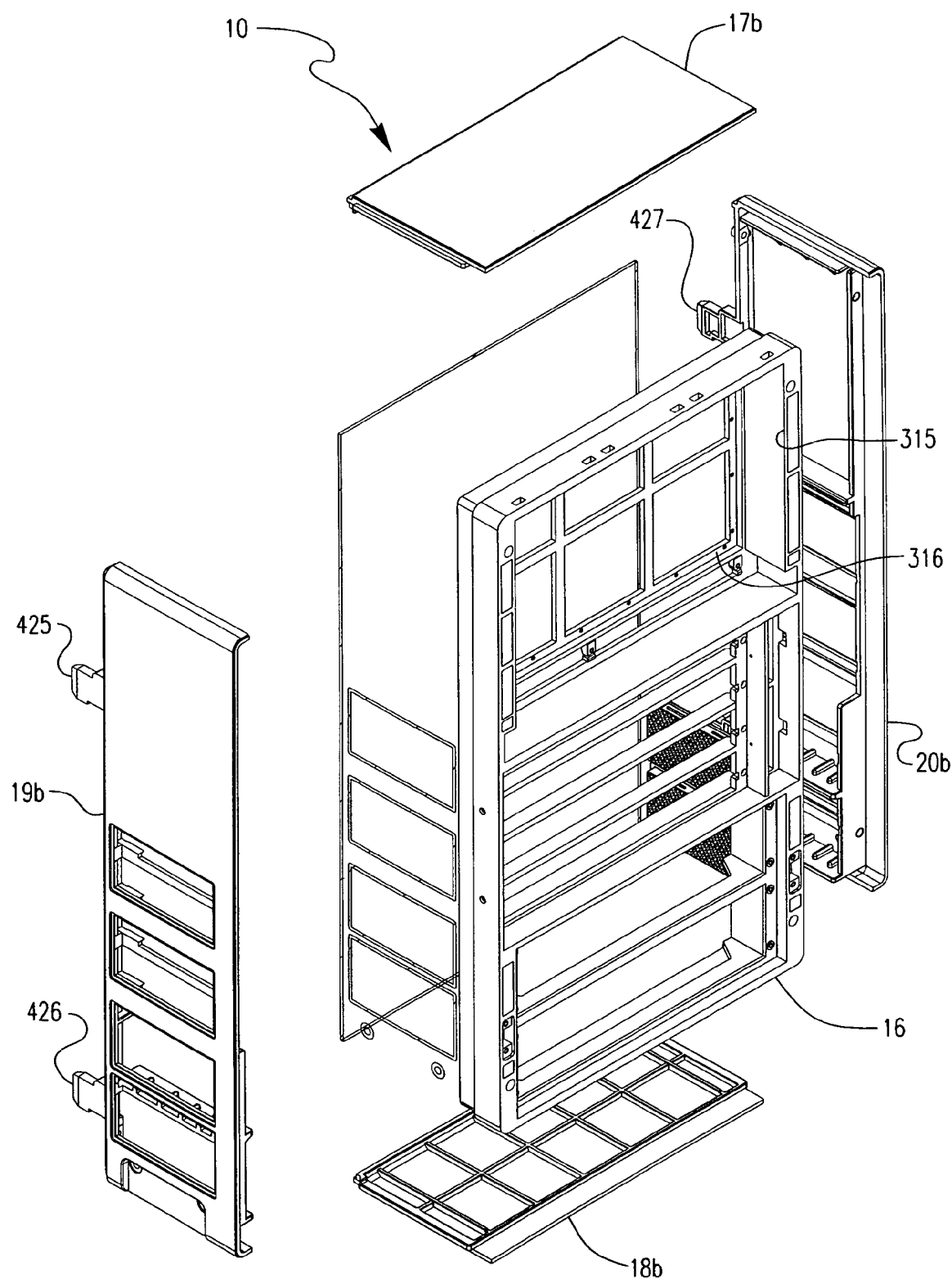
FIG. 4b is an exploded perspective view, viewed generally from the rear, of the rear section of the chassis of FIG. 1, without components.

As illustrated in FIG. 4a, the front face 15 of the chassis 1 defines openings, represented by the opening referenced by number 70, for receiving a printed circuit board assembly. The face plate 63 overlaps and abuts the portion of the chassis 1 that defines openings 70. Preferably, and EMI gasket lines the face plate 63, such that when the printed circuit board assembly 50 is positioned within the chassis 1, the gasket is squeezed or sandwiched between the face plate 63 and the chassis 1, thereby creating a seal against the leaking of electromagnetic energy.

The rear section 10 of the chassis 1 is illustrated in FIGS. 1, 2, 4b, 5, 6 and 7. With reference first to FIG. 1, the rear section 10 houses one or more power supplies 90, 91. The sides 19b and 20b of the chassis include vent panels for allowing air flow into and out of the power supplies 90, 91 as will be described in greater detail below. Vent panels on side 19b are designated by reference numbers 92, 93; reference numbers for the vent panels on opposite side 20b are not given. Connectors 94 and 95 extend from the front 96 of the power supplies 90, 91, respectively, for electrical power connection to the midplane as will be described below. Connectors 94, 95 appear in FIG. 1. The rear faces 97 of the power supplies 90, 91 are visible in FIG. 6. Connections 98, 99 are provided for connection to an external power source. (It is noted that for components such as the power supplies 90, 91 that plug into the midplane from the rear of the chassis, the terms "front" and "rear" as applied to these components may seem backward from typical parlance, but we have maintained a consistent orientation of "front" and "rear" with respect tot he chassis as a whole.)

Located above the power supplies 90, 91, is an array 105 of printed circuit board assemblies 106, 107, 108, 109. These PCB assemblies 106–109 are oriented generally horizontally. Four PCB assemblies are pictured, but it will be understood that the present invention will accommodate other numbers of PCB assemblies. As illustrated in FIG. 2, the chassis 1 includes slotted support structure 115 to engage and support the side edges of the PCB assemblies 106–109, thus supplying predetermined positions or locations for the PCB assemblies. Along the front edge of each PCB assembly 106–109 are rows 110, 111, 112, 113 of connectors, respectively, for connection to a midplane as will be described below.

Adjacent one side 20b of the chassis 1, is a side fan assembly 114 including upper and lower side fan modules 120, 121, with each fan module having two fans. The chassis sides 19b and 20b define vent panels. The vent panels on side 19b are given by reference numbers 122 and 123; there are matching vent panels on opposite 20b, though reference numerals are not provided. The operation of the fan assembly 114 and the associated vent panels will be described in greater detail below. Fan modules 120, 121 each includes power and electrical connectors 124.

Figure 5:
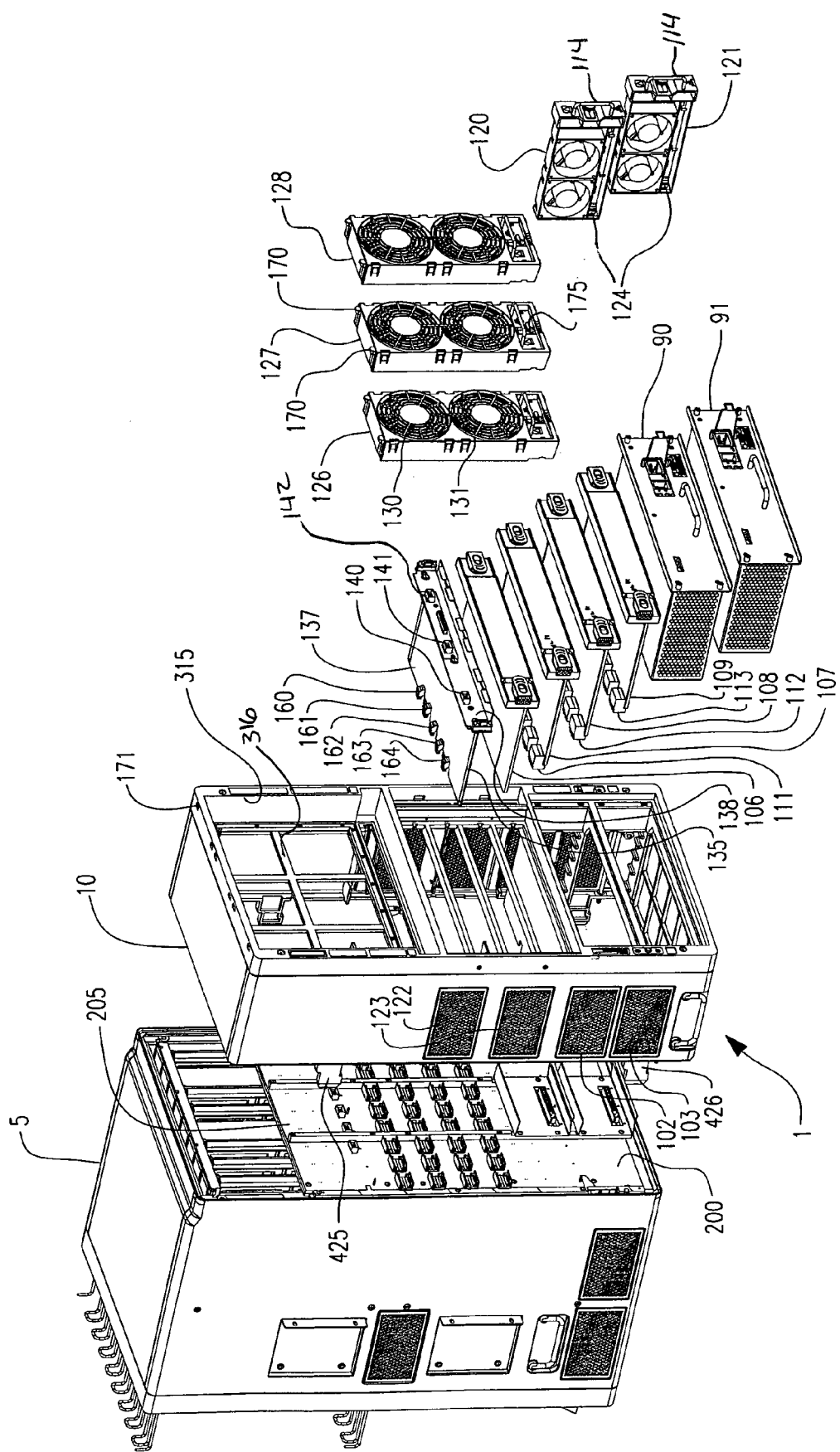
FIG. 5 is an exploded perspective view, viewed generally from the rear, of the chassis of FIG. 1 with components installed.
Figure 7:
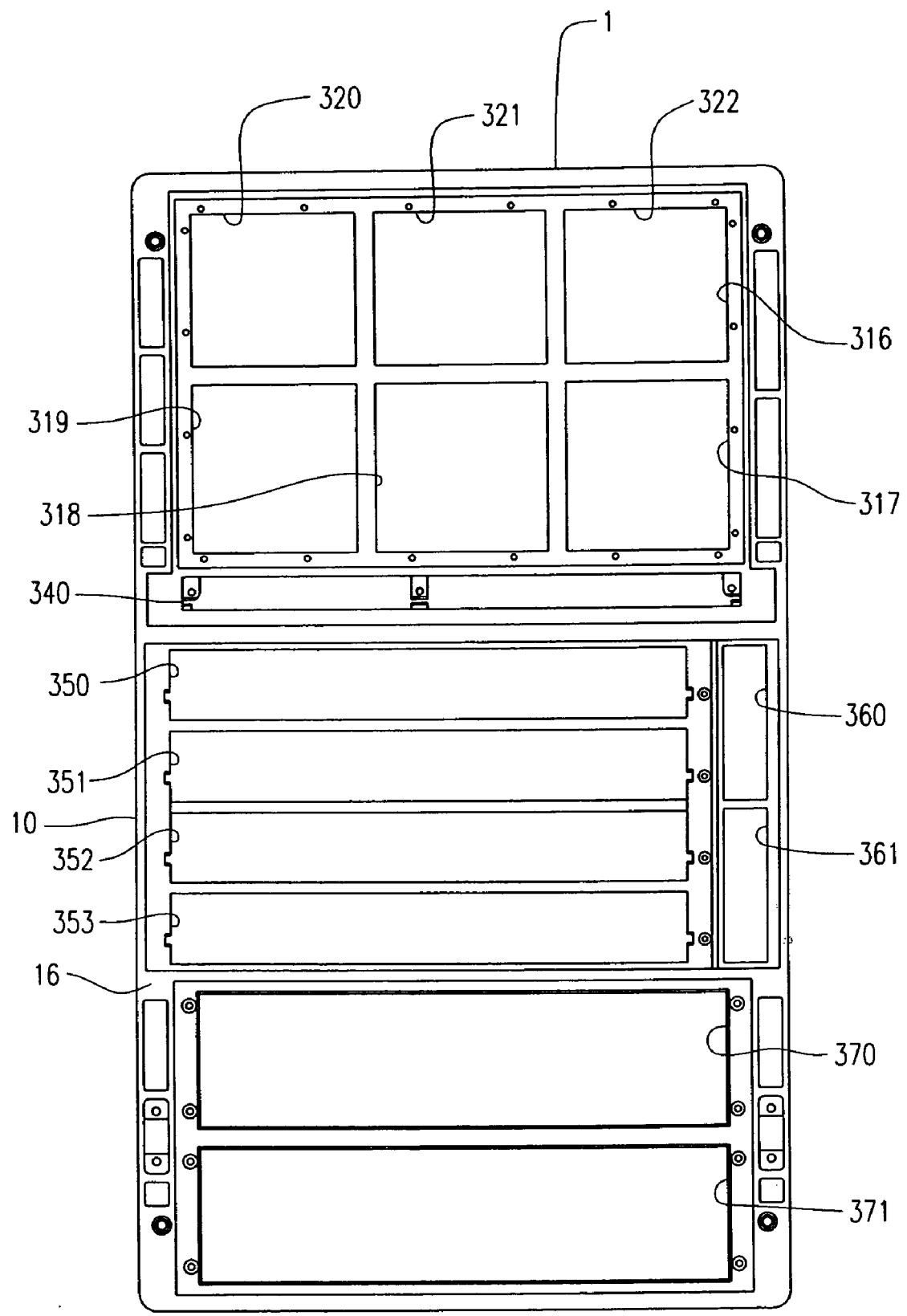
FIG. 7 is a rear view of the chassis of FIG. 1, without components installed.

As illustrated in FIGS. 1, 5 and 7, above the array 105 of PCB assemblies is a fan assembly 125. The fan assembly 125 includes three fan modules 126, 127, 128. Each fan module 126, 127, 128 includes two fans mounted in a fan frame. Representative fans are indicated by reference numeral 130, 131 in module 126. In addition, each fan module includes electrical and power connectors 129 (visible in FIG. 1) on the interior side, as mounted, of the fan module. The fan assembly 125 further mates with a printed circuit board assembly 135 having a printed circuit board 136 with front and rear edges or sides 137, 138. Electrical and power connections 140, 141, 142 visible in FIG. 5, connect to the fan assemblies mating connectors 129 to allow power and data transfer therebetween. Preferably, the fan assemblies include indicator lights 150, 151, 152 (item numbers not shown in FIG. 6), visible on the exterior of the chassis, in FIG. 6, to indicate whether the associated fans are working. Further, the printed circuit board assembly 135 provides power and data signals to the fan assemblies. Printed circuit board assembly 135 associated with the fan modules further includes high density electrical connectors 160, 161, 162, 163, 164 along its front edge 137 for connecting to the midplane as will be described below, to allow data and power transfer therebetween.

As illustrated in FIG. 5, each fan module 126, 127, 128 includes two tangs 170 projecting from its top. (Representative tangs on module 127 are numbered.) These tangs engage mating recesses 171 defined in chassis 1. The tangs 170 register the fan modules in predetermined locations. In addition, each fan module includes a spring-biased latch 175 that catches a lip on the chassis 1 thereby securing the fan module to the chassis in a manner that allows for simple, one-handed insert and removal of the module.

Rear chassis section 10 includes an air flow barrier 190, shown in FIG. 2, between the printed circuit board assemblies 106–109 and the power supplies 90, 91. This barrier 190 affects air flow through the rear section of the chassis and will be described further below.

Figure 8:
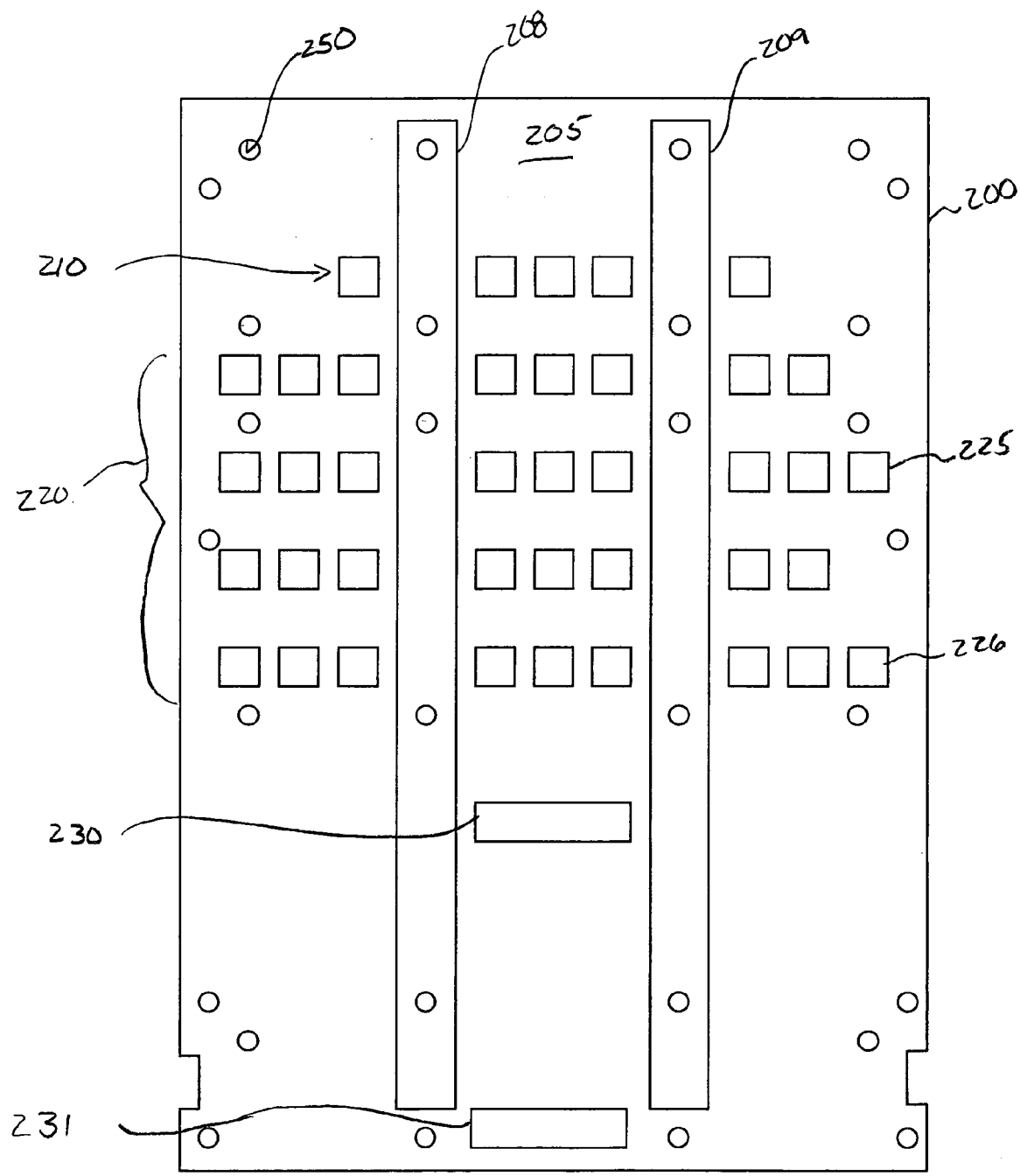
FIG. 8 is a rear view of a midplane, a component illustrated in the chassis of FIG. 5.
Figure 9:
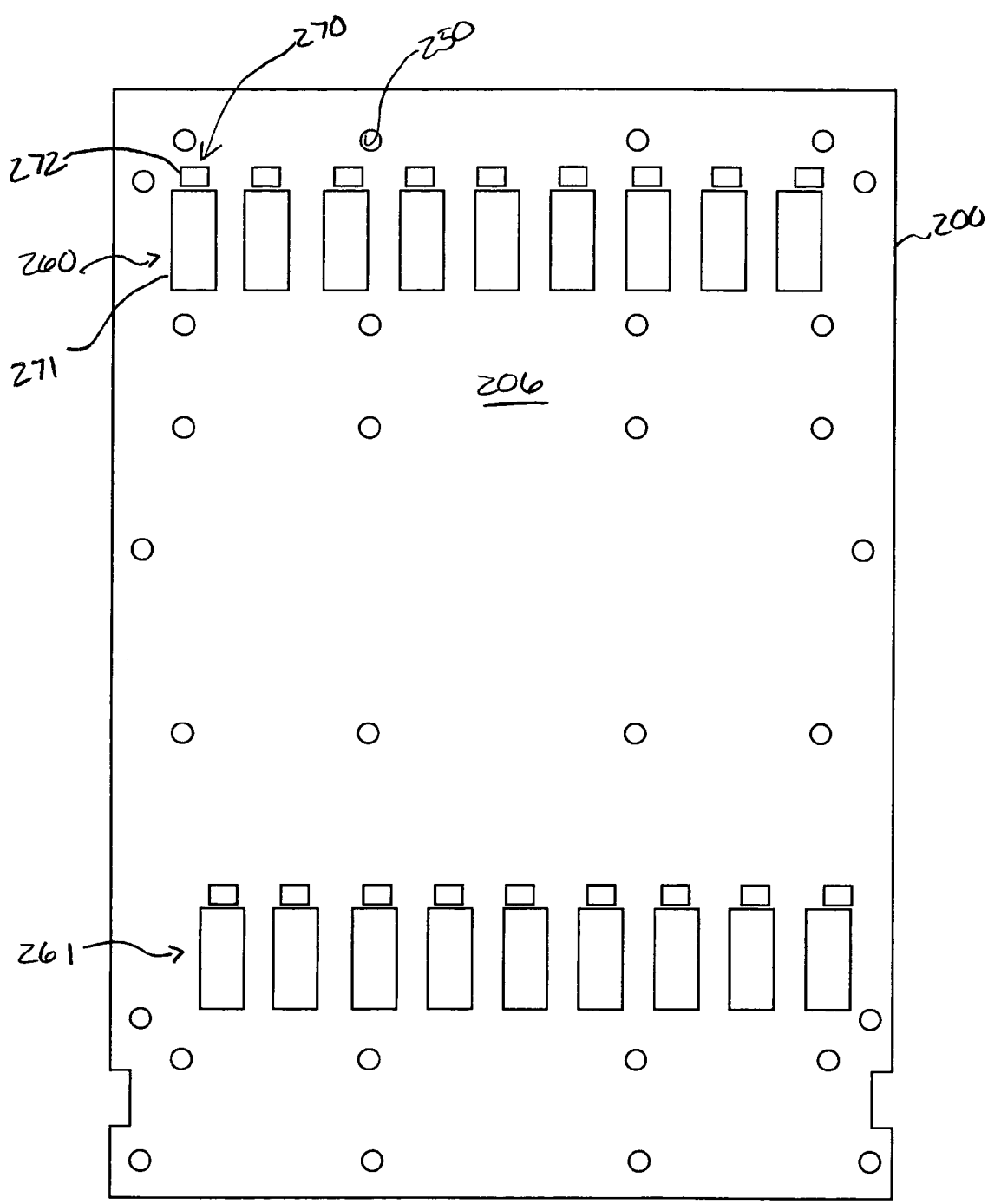
FIG. 9 is a front view of the midplane of FIG. 8.

The midplane is illustrated in FIGS. 5, 8 and 9. FIG. 5 illustrates the midplane 200 mounted in the chassis 1 immediately adjacent the mating joint 25 on the front section 5 of the chassis. The midplane 200 is screwed to a lip 310, described below, on the chassis and to the trays 30–34. FIGS. 8 and 9 schematically illustrate the midplane 200. FIG. 8 shows the rear face 205 of the midplane (also visible in FIG. 5) and FIG. 9 shows the opposite front face 206. The midplane 200 is spanned by supporting ribs 208, 209 to minimize flexing of the relatively large midplane 200. An array of five connectors 210, horizontally aligned, are provided to connect to mating fan connectors 160–164. An array 220 of thirty-two connectors, arranged in four rows of eight each, are provided for connection to the connectors 110, 111, 112, 113 on PCB assemblies 106–109 to provide data and power transfer therebetween.

The midplane 200 further includes connectors 225, 226 which connect to connectors 124 for side fan assemblies 120, 121, respectively.

Still further, the midplane 200 includes connectors 230, 231 which connect to power supply connectors 94, 95 to receive power therefrom and to monitor the status of the power supplies.

The circles in FIGS. 8 and 9 indicate screw holes that receive screws that connect the midplane to the chassis 1 or to the trays 30–33. A representative one of these screw holes is indicated by reference number 250.

FIG. 9 shows the front face 206 of the midplane 200. From this face 206 extends two arrays 260, 261 of connector sets, each array including nine connector sets 270. Each connector set 270 includes a data connector 271 and a power connector 272. Reference numbers are provided for one representative connector set 270. The data connectors 271 connect to corresponding connectors 61 of the printed circuit board assemblies 40 housed in the front section 5 of the chassis 1. The power connectors 272 connect to corresponding power connectors 62 on the same printed circuit board assemblies 40. Thus data and power connections are made to allow data and power transfer between the midplane 200 and the arrays 41, 42 of printed circuit boards 40.

FIGS. 2, 4a, 4b and 7 illustrate the chassis 1 without components installed and in various states of assembly. The chassis 1 defines openings or apertures for receiving each of the components described above (i.e. printed circuit board assemblies 40; power supplies 90, 91; rear printed circuit boards 106–109; side fan modules 120, 121 and upper fan modules 126, 127, 128). Apertures 70, shown in FIG. 4a, were described above, and accommodate the printed circuit boards in arrays 41 and 42. In addition, front face 15 of the chassis 1 includes vent apertures 300, 301 located along the lower portion of the front face 15. These apertures accommodate air flow in the cooling system as will be described below. Side panels 19a and 20a of the front section 5 include vent apertures as well. Specifically, in the embodiment illustrated, there are two lower vent apertures 303, 304 and another vent aperture 305 roughly midway along the side panel 19a. Apertures 303, 304 lie below the lower array 42 of printed circuit board assemblies when the system is assembled. Aperture 305 aligns generally with a gap between the top of the lower array 42 and the bottom of the top array 41. the apertures 303, 304, 305 are positioned generally adjacent or proximate the front face 15 of the chassis 1. In the preferred embodiment, similarly arranged vents are defined in opposite side panel 20a.

A lip 310, FIG. 4, extends along the side panels 19a, 20a and projects inwardly to the inside of the chassis immediately adjacent the midplane. In FIG. 4, the lip is 310 is only visible on side panel 20a, but a similar lip extends from side panel 19a and 18a (bottom panel). Tapped screw holes 312, 313 are located roughly adjacent or proximate the corners of the front section of the chassis. This lip 310 is also used to screw the midplane to the front section.

As illustrated in FIG. 2, the rear section 10 of the chassis defines a recessed fan compartment 315 defined by a recessed fan face 316. When assembled, the fan modules, 126, 127, 128 are positioned within this recessed compartment 316. As illustrated in FIG. 7, fan face 316 defines six apertures 317—322 that, when the fan modules are installed, align with the six fans contained in the three fan modules.

Only a representative one 318 of these apertures is numbered in FIG. 2. Aperture 340 receives the printed circuit board assembly 135 that receives data regarding the status of the fan modules 126, 127, 128 during operation. An EMI shield, not illustrated, covers the recessed compartment 316, such that when installed, the fan modules 126, 127, 128 lie to the outside of the shield.

As further shown in FIG. 7, the rear chassis defines apertures 350–353 for receiving printed circuit board assemblies 106–109. Apertures 360, 361 are adjacent the PCB apertures 350–353 and receive side fan modules 120, 121 when the system is assembled. Aperture 360 aligns generally with apertures 350 and 351; aperature 361 aligns generally with apertures 352, 353, so that the side top fan assembly located in aperture 360 is positioned to cool the top two printed circuit boards 106, 107 and the side lower fan assembly located in aperature 361 is positioned to cool the lower two printed circuit boards 108, 109 as will be described in greater detail below.

The rear chassis section 10 further defines apertures 370, 371 for receiving the power supplies 90, 91.

All of the components, except the midplane 200 can be installed and removed from the chassis 1 without opening the chassis. Specifically, printed circuit board arrays 41, 42 can be installed or removed through the front face 16 of the chassis. The fan modules 126, 127, 128, the power supplies 90, 91, the side fan modules 120, 121, and the rear printed circuit board assemblies 106–109 can be installed or removed through the rear face 16 of the chassis. This facilitates simple and quick maintenance and service for repair and upgrading the system. Each component thus resides in predetermined positions and its connectors simply snaps into mating connections in the midplane.

A captive hardware assembly 400 join the front and rear chassis sections to one another. As illustrated in FIG. 2, the captive hardware assembly 400 includes a spring-biased pin 401 mounted in the chassis and extending through the rear section 10. The pin 401 has a first end 402 that is slotted for a phillips head screwdriver. The opposite end 403 is threaded to engage a mating tapped recess or hole 312, 313 (FIG. 4) in the front section 5 of the chassis 1. In a preferred embodiment, four such captive hardware assemblies 400 are employed, generally proximate the four corners of the chassis. When the hardware assembly 400 is disengaged, it is spring-biased to extend from the rear chassis, but it retained within the rear chassis. Because it is captive in this manner and because it is self-locating, the front and rear sections can be easily joined without loose screws and the like getting lost and having to be replaced.

Figure 17:
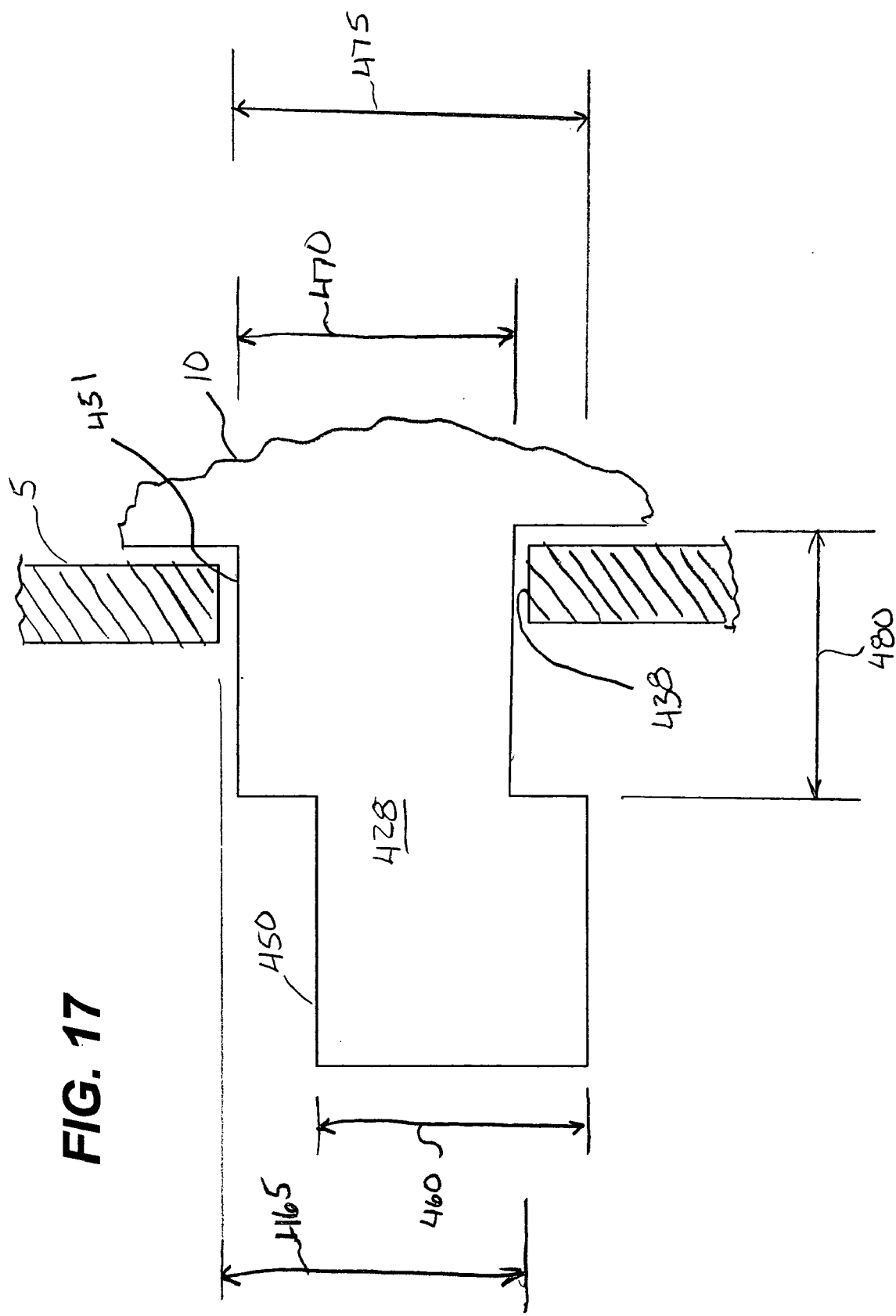
FIG. 17 is an enlarged partial view of a tab at the juncture between front and rear sections of the chassis of FIG. 1.

Tabs 425, 426, 427 (and a fourth 428, not visible in the views illustrated) extend from one section (in the illustrated embodiment, from the rear section 10) of the chassis adjacent the midplane joint. Mating recesses 435, 436, 437, 438 are defined in the front section 5. The tabs 425, 426, 427, 428 have a stepped configuration. FIG. 17 is an enlarged partial side view of one such tab 428 in position in mating recess 438 when the front and rear sections 5, 10 of the chassis 1 are joined. The tab 428 includes front and rear portions 450, 451. Rear portion 451 is vertically displaced or steps up from front portion 450. During the joining of the front and rear chassis sections 5, 10, the tabs 428 (and 425–427) prevent damage to the high density connectors that connect components to the midplane 200. Further, the tabs act as guide pins to protect the EMC gasket along the mating joint 25. The stepped configuration of the tabs 425–428 prevents the chassis sections 5, 10 to be disengaged inadvertently, thereby preventing damage to the connectors.

When removing the rear chassis section 10 from the front chassis section 5, the tabs 425–428 prevent damage to the high density connectors and EMC gasket. After the four captive hardware assemblies 400 are disengaged, the rear chassis section 10 rests on the four tabs 425–428. The tabs 425–428 allow the rear chassis assembly to be pulled directly back from the front chassis section 5, until the high density connectors and EMC gasket is cleared. After this clearance is made, the rear section 10 is lifted up and then further rearward to fully separate the rear chassis section 10 from the front 5.

As will be appreciated from this description of the operation of the tabs 425–428, a handful of relative dimensions are beneficially chosen. These are illustrated in FIG. 17. The height 460 of tab front portion 450 is a bit smaller than the height 465 of aperture 438. Similarly the height 470 of the tab rear portion 451 is smaller than the height 465 of the aperture 438. The distance 475 from the top of the tab rear portion 451 to the bottom of the tab front portion 350 is greater than the height 465 of the aperture 438. the length 480 of the tab rear portion is roughly similar to the distance the connectors on components in the rear section must travel to clear their mating connectors on the midplane.

To join the front and rear sections 5, 10, the sections 5, 10 are brought into close proximity. Tabs 425–428 are positioned adjacent their respective mating recesses, 435–438. The proper alignment of the tabs insures proper registry of the front and rear sections 5, 10. When the front and rear sections 5, 10 are fully joined, captive hardware assemblies 400 are tightened such that their pins 401 engage the front chassis section 5, thereby securing the sections together.

Because all connections of the components to the midplane 200 are made through high density connectors or power connectors mating with mating connectors on the midplane, no wiring is needed. All components simply plug into the midplane 200.

Figure 10:
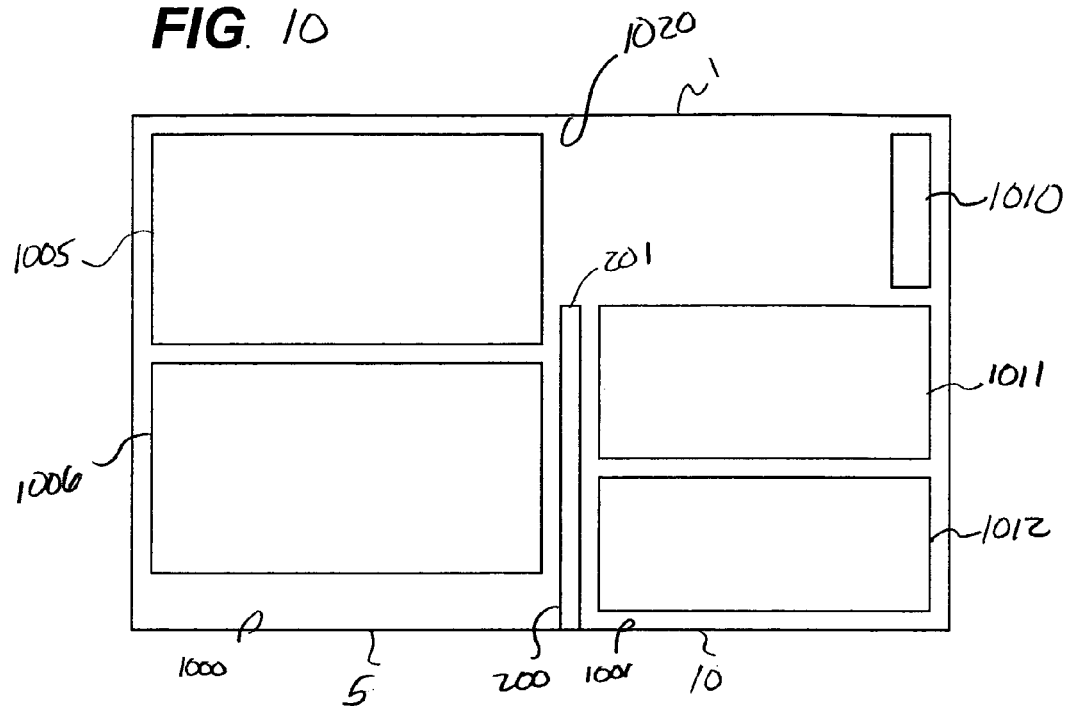
FIG. 10 is a schematic side elevational view of the layout of the chassis of FIG. 1 with components installed.
Figure 11:
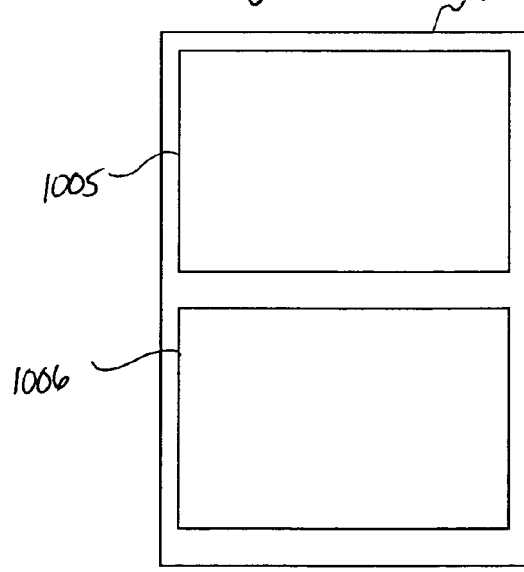
FIG. 11 is a schematic front elevational view of the layout of the chassis of FIG. 1 with components installed.
Figure 12:
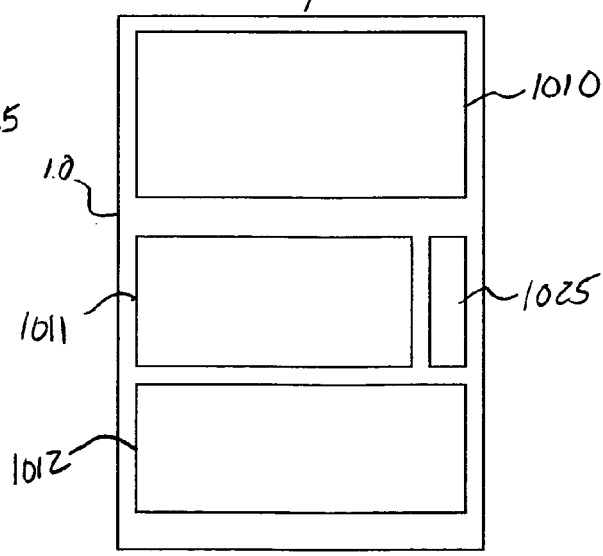
FIG. 12 is a schematic rear view of the layout of the rear section of components in a chassis of FIG. 1.

FIGS. 10, 11 and 12 schematically illustrate the layout of the preferred embodiment of the chassis 1 and the components within the chassis. FIG. 10 is a side sectional view. The chassis 1 includes generally front and rear section compartments 1000, 1001 divided by a midplane 200. The front section 1000 includes an upper and a lower compartment 1005, 1006 for arrays of printed circuit board assemblies. The rear section 1001 includes a rear fan compartment 1010. Below the fan compartment 1010 is a printed circuit board assembly compartment 1011. At the bottom of the rear section 1001 is the power supply compartment 1012. The midplane terminates at its top edge 201 below the top of the chassis 1, such that a gap 1020 is defined between the top edge 201 of the midplane 200 and the chassis 1.

FIG. 11 is a front sectional view of the front section 5 of the chassis 1, again illustrated schematically. Compartments 1005, 1006 for printed circuit board assemblies are shown.

FIG. 12 is a rear sectional view of the rear section 10 of the chassis 1. A side fan compartment 1025 is shown adjacent the printed circuit board compartment 1011.

Figure 13:
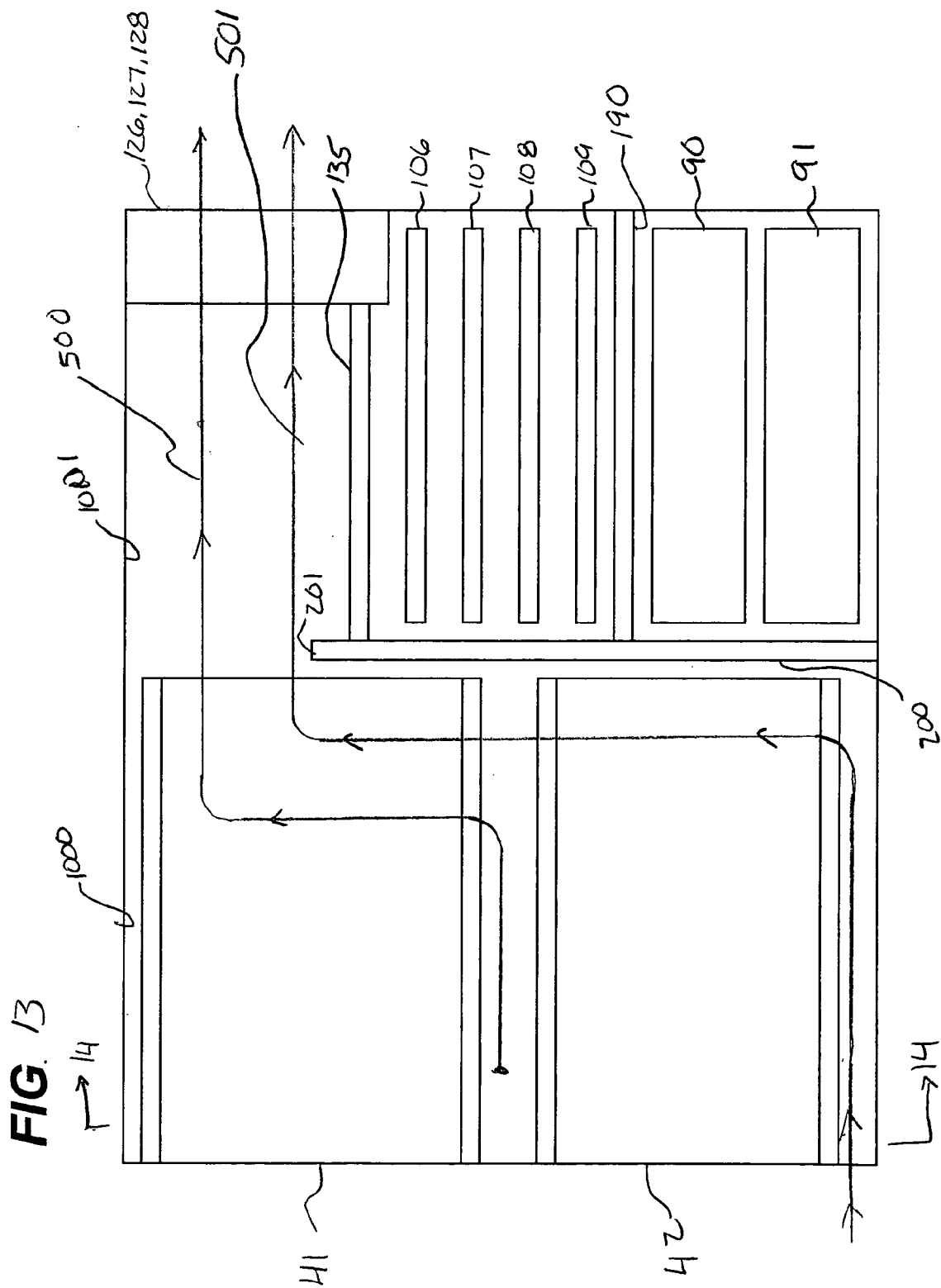
FIG. 13 is side view schematically illustrating air flow through the chassis of FIG. 1 with components installed.

The cooling system for the chassis 1 and the air flow through the system is described with reference to FIGS. 13–16. As shown in FIG. 13, the fans in the fan modules 126, 127, 128 are positioned at the rear of the chassis. Vents are located at the lower front of the chassis (vents 36, FIG. 2), on the lower sides of the chassis (vents 38, FIG. 2), and on the mid-sides near the front of the chassis (vents 37, FIG. 2). The fans are oriented to exhaust air from inside the chassis 1 to the environment. The printed circuit board assembly 135 for the fans acts as an air flow barrier between the upper portion of the rear section of the chassis and the printed circuit boards 106–109. Thus, when the fans are operating, air enters the chassis through the vents (36, 37, 38, FIG. 2) in the front section of the chassis. The fans pull air from the front section 1000 of the chassis, over the top edge 201 of the midplane 200 and exhaust the air through the rear face of the chassis to the environment. This path of the air flow is suggested by arrowed lines 500 and 501. It will be understood, however, that these lines only schematically represents only the general direction of air flow and do not literally describe the air flow; in other words, it will be apparent, for example, that the incoming air fills the front section 1000, passing by the entire surface area of the printed circuit boards in the arrays 41, 42, and does not follow as distinct, linear, and square path as that suggested by the arrowed lines 500, 501. This is the case with all of the arrowed lines representing air flow in FIGS. 13–16.

Figure 14:
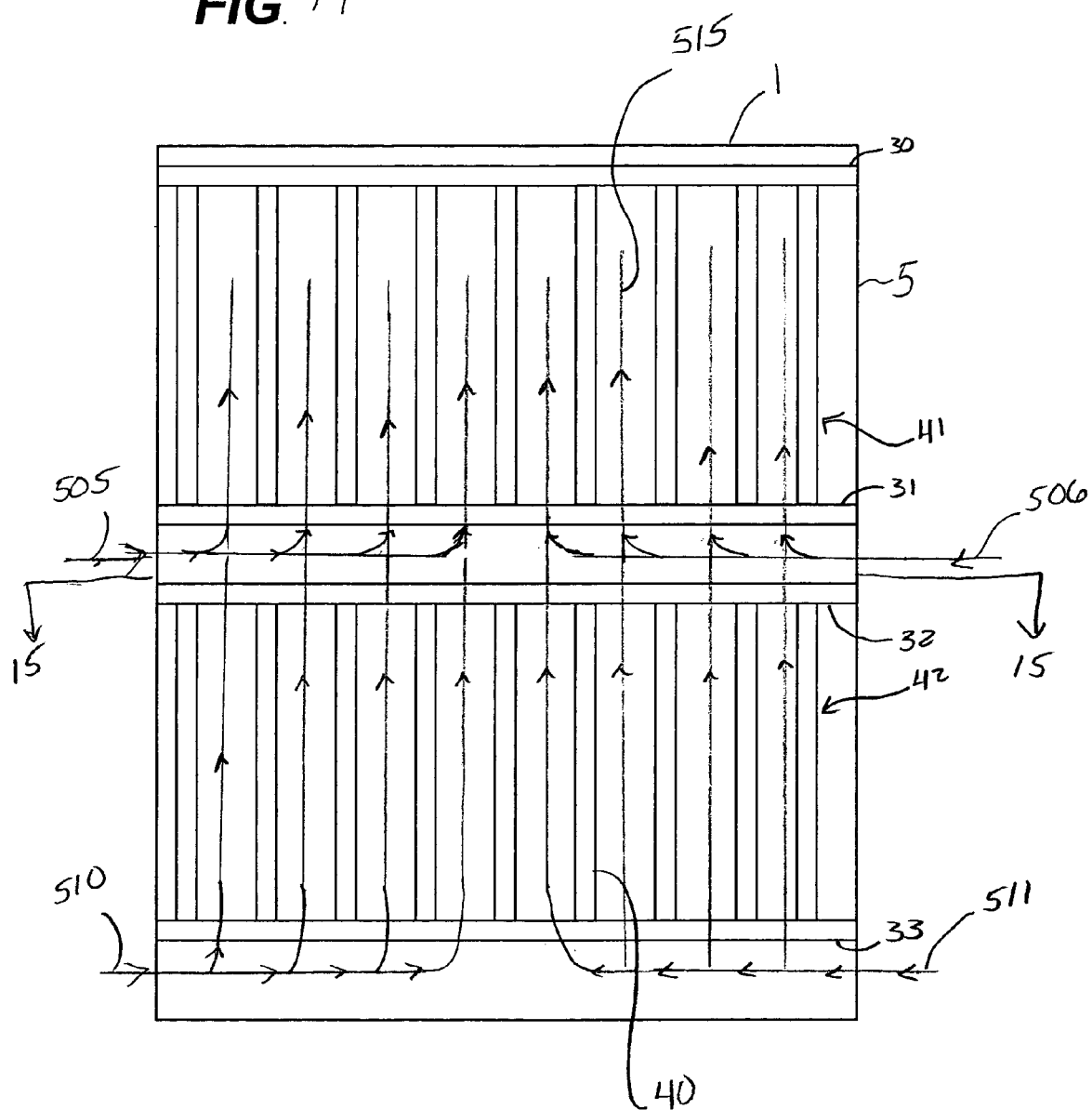
FIG. 14 is a front view schematically illustrating air flow through the front section of the chassis of FIG. 1 with components installed.

FIG. 14 illustrates this same air flow path with a cross-sectional view of the front section 5 of the chassis 1, taken along lines 14—14 in FIG. 13. This view illustrates that air is drawn through the upper side vents (vents 37, FIG. 2), as indicated by arrowed lines 505, 506, and through the lower vents (vents 38, FIG. 2) as indicated by arrowed lines 510, 511. The gap between the upper and lower sets of trays (i.e. between trays 31 and 32) allows air to flow horizontally across the front section 1000 of the chassis 1. The gap below the lowermost tray 33 similarly allows air to flow horizontally across the front section 1000 of the chassis. Air is drawn upward between the printed circuit boards in arrays 41, 42, and indicated by the generally vertical lines, typified by the line labeled 515. Once the air clears the top of the midplane, it is drawn rearward, as described above with respect to FIG. 13.

Figure 15:
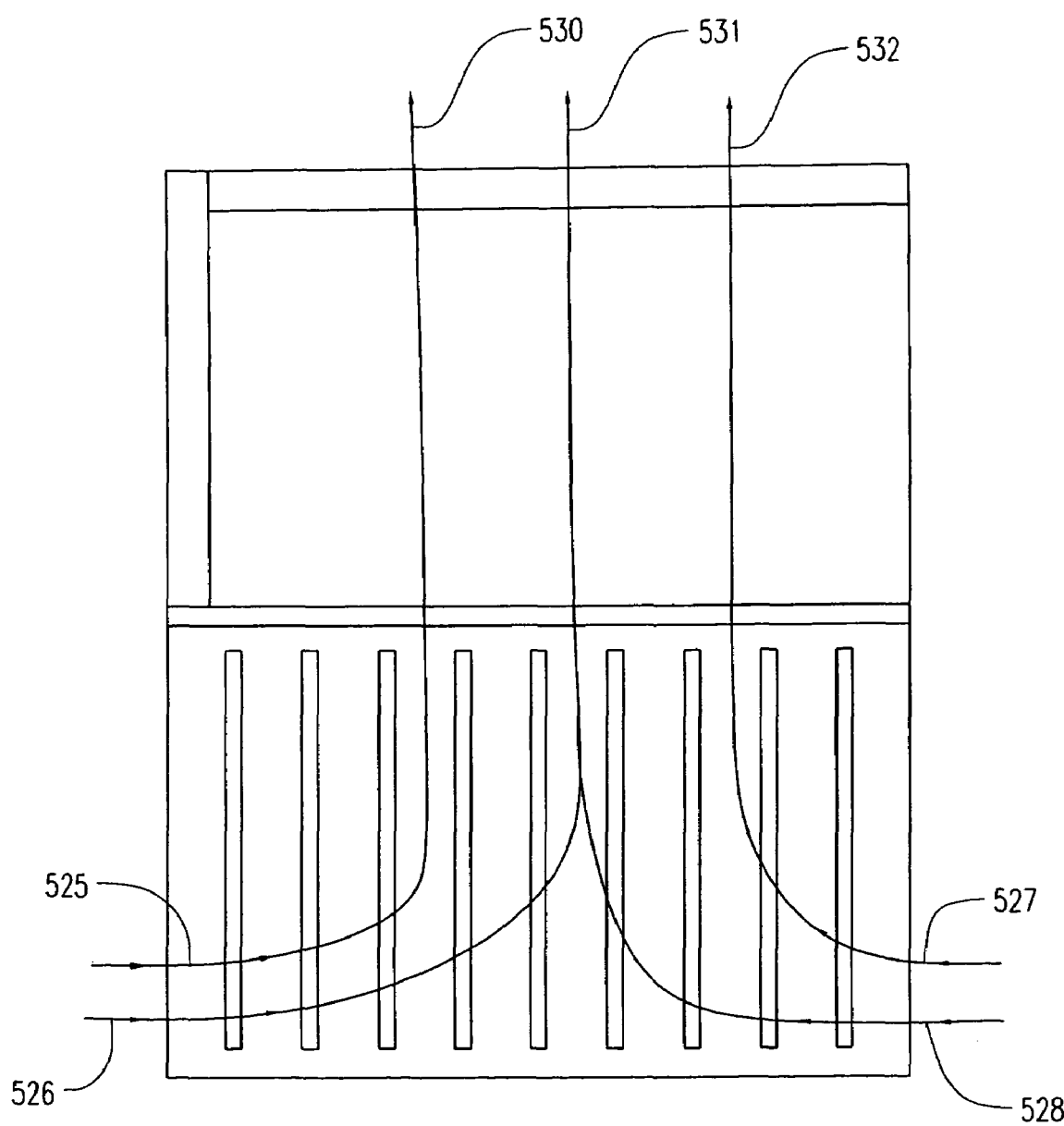
FIG. 15 is a top view schematically illustrating air flow through the chassis of FIG. 1 with components installed.

FIG. 15 is a cross sectional view taken along line 15—15 in FIG. 14 and further illustrates the air flow from the front section of the chassis to the rear. Air is drawn through the side vents, passes horizontally across the front section as indicated by arrowed lines 525, 526, 527, 528, and is then drawn rearward as indicated by arrowed lines 530, 531, 532.

Figure 16:
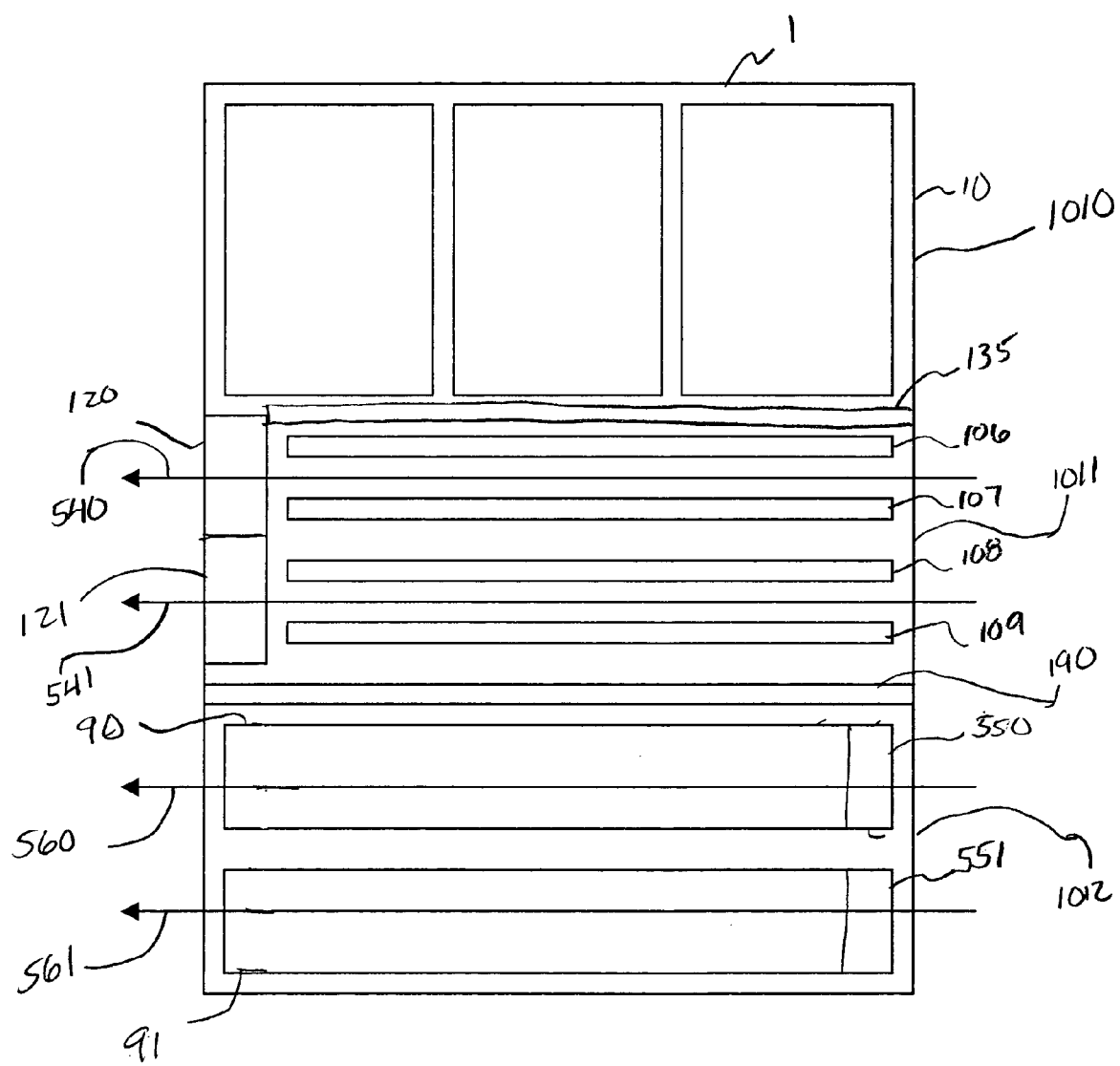
FIG. 16 is a front view of the rear section of the chassis schematically illustrating air flow through the rear section of the chassis of FIG. 1 with components installed.

Air flow across the rear section of the chassis is illustrated in FIG. 16 (looking from the inside of the rear chassis 10). Fans in fan modules 120, 121 draw air generally horizontally across the rear section 10 of the chassis. More specifically, these fans 120, 121 draw air through the middle compartment 1011 of the rear section as indicated by arrowed lines 540, 541. Vents (vents 122, 123, FIG. 2) on each side of the compartment 1011 facilitate this air flow. This middle compartment houses the printed circuit boards 106–109. The top of the middle compartment is generally closed by the fan printed circuit board assembly 135. The bottom of the middle compartment is generally closed by a barrier 190. Barrier 190 also serves to protect the printed circuit board assemblies 106–109 from electromagnetic energy from the power supplies 90, 91 located in the lower compartment 1012 below the middle compartment 1011.

As further illustrated in FIG. 16, the power supplies 90, 91 include built in fans 550, 551 which push air generally horizontally across the rear section 10 of the chassis 1. More specifically, these fans 550, 551 push air across the lower compartment 1012 of the rear section as indicated by arrowed lines 560, 561.

It is preferred that air is moved across compartment 1011 in the same direction as air is moved across compartment 1012. In this manner, warmed air from both compartments is exhausted from the same side of the chassis. In other words, air flows in the same direction through these two compartments 1011, 1012. This prevents immediate recirculation of this warmed air, as would occur if these compartments exhausted on opposite sides. In the preferred embodiment, fans 120, 121 are oriented and positioned to pull air and fans 550, 551 are oriented and positioned to push air.

The electrical circuitry assembly, including the described components housed in the described chassis provides a system having sufficient redundancy to provide reliable operation even when a component is not working. For example, two power supplies ensures that the system will be powered even if one power supply fails. The ability to replace a component without disrupting other components allows service while the system is operating, thereby reducing the frustration and potential data or operational loss associated with failed components.

For convenient reference, here follows a table showing the reference numbers for connectors on components and mating connectors on the midplane:

| COMPONENT | Connectors on Component | Mating Connectors on Midplane | Component Connectors shown in FIG. |
|---|---|---|---|
| PCB 135 for fan modules 126–128 | 160–164 | 210 | 1 |
| Rear PCBs 106–109 | (110), 111, 112, 113 | 220 | 5 |
| Power supplies 90, 91 | 94, 95 | 230, 231 | 1 |
| Side fan modules 120, 121 | 124 | 225, 226 | 1 |
| Electrical connections for front PCBs (e.g. 50) | 61 | 271 | 1 |
| Power for front PCBs (e.g. 50) | 62 | 272 | 1 |

A number of advantageous components or features may be incorporated with the modular chassis described herein though they are not necessarily described in the preceding text. Such features are described in other patent applications, listed below, that are hereby incorporated by reference:

| Title | Filing Date | USSN | Atty. Matter No. |
|---|---|---|---|
| EMI Shielded Chassis for Electrical Circuitry | Jun. 21, 2004 | | 3060 |
| Waveguide Power Supply Enclosure | Jun. 21, 2004 | | 3057 |
| Removable Ribs in a Chassis Housing to Accommodate Extra-Wide Printed Circuit Board Assemblies | Jun. 21, 2004 | | 3058 |
| Surrogate Card for Printed Circuit Board Assembly | Jun. 21, 2004 | | 3061 |
| Guide Pin and Guide Pin Assembly | Jun. 21, 2004 | | 3062 |
| Fan Module | Jun. 21, 2004 | | 3063 |

A surrogate card 2000 is illustrated in FIG. 1. A guide pin 3000 is illustrated on printed circuit board assembly 60 in FIG. 1. Fan modules 125 are described to some extent, but greater detail is found in the reference identified in the above table.

Although an illustrative version of the device is shown, it should be clear that many modifications to the device may be made without departing from the scope of the invention.

I claim:

1. A chassis having front and rear sides for housing electrical circuitry, comprising:

a) a front section having a top face, bottom face, and two sides faces, said side faces being parallel to one another and perpendicular to said top and said bottom face;

b) a rear section having a top face, bottom face, and two sides faces, said side faces being parallel to one another and perpendicular to said top and said bottom face, said chassis sections being separable from each other; and c) captive hardware extending through one said section and into the other said section to mechanically connect the sections to one another, said hardware being accessible from one side of the chassis.

2. An assembly for electronic circuits according to claim 1, wherein said captive hardware is accessible from the exterior of said chassis.

3. A chassis having front and rear sides for housing electrical circuitry, comprising:
a) a front section;
b) a rear section, said chassis sections meeting at a mating joint extending around the periphery of the chassis and said chassis sections being separable from each other; and
c) tabs extending from one said section adjacent said mating joint and transversing the junction of said front and rear chassis sections when said sections are joined, said tabs having a stepped shape;
d) recesses in the other said section configured to mate with said tabs.

4. An assembly for electronic circuits comprising:
a) a front chassis section;
b) a rear chassis section, said chassis sections being separable from each other; and
c) a midplane located at the junction of the front and rear sections, said midplane being a printed circuit board.

5. An assembly according to claim 4 further comprising:
d) a first array of printed circuit board assemblies housed within said front section, and removably mechanically mated with and electrically connected directly to said midplane for data transfer therebetween.

6. An assembly for electronic circuits according to claim 4, wherein said front chassis section includes a pair of associated trays for receiving the edges of a printed circuit board; and further comprising:
d) a printed circuit board positioned in said tray and physically and electrically connected to said midplane.

7. An assembly for electronic circuits according to claim 4 further comprising:
c) tabs extending from one said chassis section adjacent said mating joint and transversing the junction of said front and rear chassis sections when said sections are joined, said tabs having a stepped shape;
d) recesses in the other said section configured to mate with said tabs.

8. An assembly for electronic circuits comprising:
a) a front chassis section;
b) a rear chassis section, said chassis sections being separable from each other; and
c) a midplane located at the junction of the front and rear sections;
d) a first array of printed circuit board assemblies housed within said front section, and removably connected directly to said midplane for data transfer therebetween; and
e) a second array of printed circuit boards housed within said rear section and orthogonally oriented to said first array, said second array removeably connected to said midplane for data transfer therebetween.

9. An assembly according to claim 8, further comprising:
f) power supply assembly housed within said rear chassis section and removably connected directly to said midplane to provide power to the midplane and to components connected to the midplane through power connections; and wherein said printed circuit board assemblies are electrically connected to said midplane to receive power therefrom.

10. An assembly for electronic circuits comprising:
a) a front chassis section;
b) a rear chassis section, said chassis sections being separable from each other; and
c) a midplane located at the junction of the front and rear sections; and
d) power supply assembly housed within said rear chassis section and removably connected directly to said midplane to provide power to the midplane and to components connected to the midplane through power connections.

11. An assembly for electronic circuits comprising:
a) a front chassis section;
b) a rear chassis section, said chassis sections being separable from each other; and
c) a midplane located at the junction of the front and rear sections; and
d) fan module housed within said rear chassis section and connected to said midplane.

12. An assembly for electronic circuits comprising:
a) a front chassis section;
b) a rear chassis section, said chassis sections being separable from each other; and
c) a midplane located at the junction of the front and rear sections,
d) a first array of printed circuit board assemblies housed within said front section and removably connected directly to said midplane for data and power transfer therebetween;
e) a second array of printed circuit boards housed within said rear section, said second array removeably connected to said midplane for data and power transfer therebetween;
f) power supply assembly housed within said rear chassis section and removably connected directly to said midplane for power supply thereto; and
g) fan module housed within said rear chassis section and connected to said midplane for data and power transfer therebetween.

13. A cooling system for a chassis for housing electrical circuitry comprising:
a) a chassis having a parallelepiped shape and housing printed circuit boards therein;
b) air intake vents located at the lower front portion of the chassis; and
c) fan located at the upper back portion of the chassis and oriented to exhaust air from the chassis to the environment.

14. A cooling system for electrical circuitry housed in a chassis having first and second opposite sides, comprising:
a) printed circuit board assembly in a first compartment within said chassis;
b) power supply unit located in a second compartment adjacent said first compartment;
c) first fan within said first compartment oriented to draw air in from the environment on one side of said chassis;

d) second fan within said second compartment oriented to push air out of the opposite side of the chassis, such that air from both compartments exhausts on the same side of the chassis.

15. A cooling system in an electrical circuitry assembly housed in a chassis having front and rear sections comprising:
   a) a vertically oriented midplane dividing the front and rear sections, said midplane extending between the bottom of the chassis and terminating below the top of the chassis, thereby defining a gap between the top of the midplane and the top of the chassis, allowing fluid communication between the front and rear compartments;
   b) air intake vent in the chassis of the front section and located lower than the top of the midplane; and
   c) fan located at the upper portion of the rear section and oriented to exhaust to the rear of the chassis, such that during operation the fans draw air rearward and upward through the front section, over the top of the midplane and out the rear of the chassis.

16. A cooling system according to claim 15 wherein said air intake vent is located adjacent the bottom of the front section.

17. A cooling system according to claim 15, further comprising:
   d) a first array of printed circuit boards in the front section of the chassis;
   e) a second array of printed circuit boards in a first compartment within the rear section of said chassis, said second array being connected to said midplane for data and power transfer therebetween and said compartment located below said fan;
   f) power supply unit located in a second compartment within said rear section adjacent said first compartment;
   g) second fan within said first compartment oriented to draw air in from the environment on one side of said chassis;
   h) third fan within said second compartment oriented to push air out of the opposite side of the chassis, such that air from both compartments exhausts on the same side of the chassis.

18. An assembly for electronic circuits comprising:
   a) a front chassis section;
   b) a rear chassis section, said front and rear chassis sections forming the exterior housing of the assembly, each said chassis section having top and bottom faces and two side faces, and said chassis sections being separable from each other; and
   c) a midplane located at the junction of the front and rear sections.

19. An assembly for electronic circuits comprising:
   a) a front chassis section;
   b) a rear chassis section, said chassis sections being separable from each other; and
   c) a midplane located at the junction of the front and rear sections, wherein said midplane has front and back surfaces and contains electrical and physical connections on at least one side for engaging printed circuit boards.

20. An assembly for electronic circuits according to claim 19, wherein said midplane has electrical and physical connections on both said sides for engaging printed circuit boards.

21. An assembly for electronic circuits according to claim 19 wherein a midplane joint is defined between said front and rear chassis sections, and wherein said midplane is mounted to one said section immediately adjacent the mating joint.

22. An assembly for electronic circuits according to claim 21, wherein one said chassis section includes a lip projecting to the inside of the chassis immediately adjacent the miplane joint, and wherein said midplane mounts to said lip.

* * * * *